(12) United States Patent
Nandi et al.

(10) Patent No.: US 9,471,278 B2
(45) Date of Patent: Oct. 18, 2016

(54) LOW AREA FULL ADDER WITH SHARED TRANSISTORS

(71) Applicant: Texas Instruments Incorporated, Dallas, TX (US)

(72) Inventors: Suvam Nandi, Bangalore (IN); Badarish Mohan Subbannavar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 210 days.

(21) Appl. No.: 14/496,767

(22) Filed: Sep. 25, 2014

(65) Prior Publication Data

US 2016/0092170 A1    Mar. 31, 2016

(51) Int. Cl.
| G06F 7/501 | (2006.01) |
| G06F 7/50 | (2006.01) |
| H03K 19/20 | (2006.01) |
| H03K 19/00 | (2006.01) |

(52) U.S. Cl.
CPC ............. *G06F 7/50* (2013.01); *H03K 19/0013* (2013.01); *H03K 19/20* (2013.01)

(58) Field of Classification Search
None
See application file for complete search history.

(56) References Cited

U.S. PATENT DOCUMENTS

| 3,843,876 A | * | 10/1974 | Fette | ...................... G06F 7/503 708/702 |
| 4,713,790 A | * | 12/1987 | Kloker | .................... G06F 7/503 326/53 |
| 4,733,365 A | * | 3/1988 | Nagamatsu | .......... H03K 19/215 708/702 |
| 4,831,578 A | * | 5/1989 | Bui | ........................ G06F 7/501 708/702 |
| 5,233,233 A | * | 8/1993 | Inoue | ..................... G06F 7/503 326/21 |
| 5,617,345 A | * | 4/1997 | Kamijo | ................. G06F 7/5318 708/620 |
| 2016/0092170 A1 | * | 3/2016 | Nandi | ...................... G06F 7/50 708/230 |

* cited by examiner

*Primary Examiner* — David H Malzahn
(74) *Attorney, Agent, or Firm* — John R. Pessetto; Frank D. Cimino (57) ABSTRACT

A full adder is disclosed that utilizes low area. The full adder includes an exclusive NOR logic circuit. The exclusive NOR logic circuit receives a first input and a second input. A first inverter receives an output of the exclusive NOR logic circuit and generates an exclusive OR output. A carry generation circuit receives the output of the exclusive NOR logic circuit, the exclusive OR output and a third input. The carry generation circuit generates an inverted carry. A second inverter is coupled to the carry generation circuit and generates a carry on receiving the inverted carry. A sum generation circuit receives the output of the exclusive NOR logic circuit, the exclusive OR output and the third input. The sum generation circuit generates an inverted sum. A third inverter is coupled to the sum generation circuit and generates a sum on receiving the inverted sum.

18 Claims, 3 Drawing Sheets

LOW AREA FULL ADDER WITH SHARED TRANSISTORS

TECHNICAL FIELD

The present invention relates to an integrated circuit, and more particularly, to a full adder implemented using MOS transistors.

BACKGROUND

As a result of the continuous developments in integrated circuits (ICs), the full adders contribute to a substantial portion of any circuit design's area and power. The various units of an IC that consume power are logic implementation, full adders, flip flops, RAM, clock tree and integrated clock gating (ICG) cells. The full adders consume 30-40% of the total area and 30-40% of the total power in a typical digital design.

The power consumed by a full adder is directly proportional to a number of transistors used for implementing the full adder. Thus, it is apparent that with reduced transistor count, the power consumed by the full adder can also be reduced. Also, a reduction in area of the full adder will directly translate to reduction in chip area and saving of costs. Also, since the full adders are most critical in the data path, improving the area and power consumed by the full adder improves the performance of the digital designs using the full adder.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a full adder. The full adder includes an exclusive NOR logic circuit. The exclusive NOR logic circuit receives a first input and a second input. A first inverter receives an output of the exclusive NOR logic circuit and generates an exclusive OR output. A carry generation circuit receives the output of the exclusive NOR logic circuit, the exclusive OR output and a third input. The carry generation circuit generates an inverted carry. A second inverter is coupled to the carry generation circuit and generates a carry on receiving the inverted carry.

A sum generation circuit receives the output of the exclusive NOR logic circuit, the exclusive OR output and the third input. The sum generation circuit generates an inverted sum. A third inverter is coupled to the sum generation circuit and generates a sum on receiving the inverted sum.

Other aspects and example embodiments are provided in the Drawings and the Detailed Description that follows.

DETAILED DESCRIPTION OF THE EMBODIMENTS

Figure 1:
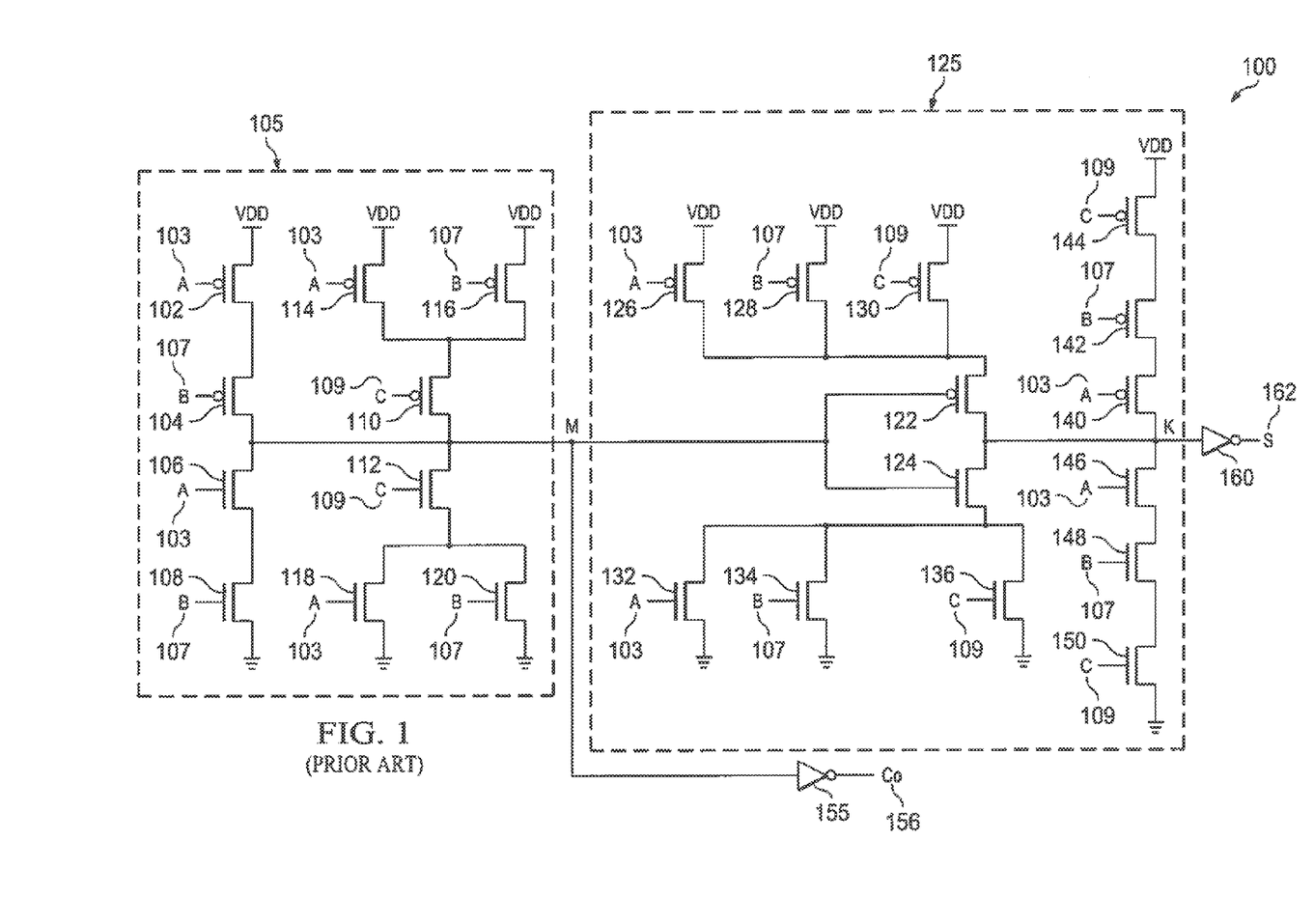
FIG. 1 illustrates a conventional full adder.

FIG. 1 illustrates a conventional fill adder 100. The conventional full adder 100 includes a carry generation circuit 105, a sum generation circuit 125, a first inverter 155 and a second inverter 160. The carry generation circuit 105 is explained now. The carry generation circuit 105 includes a first PMOS transistor 102 whose gate terminal receives a first input A 103 and whose source terminal is coupled to a power terminal VDD. A drain terminal of the first PMOS transistor 102 is coupled to a source terminal of a second PMOS transistor 104. A gate terminal of the second PMOS transistor 104 receives a second input B 107.

A drain terminal of the second PMOS transistor 104 is coupled to a first node M. The carry generation circuit 105 further includes a first NMOS transistor 106 whose gate terminal receives a first input A 103 and whose drain terminal is coupled to the first node M. A source terminal of the first NMOS transistor 106 is coupled to a drain terminal of a second NMOS transistor 108. A gate terminal of the second NMOS transistor 108 receives the second input B 107 and a source terminal of the second NMOS transistor 108 is coupled to a ground terminal.

The carry generation circuit 105 further includes a third PMOS transistor 114, a fourth PMOS transistor 116, a fifth PMOS transistor 110, a third NMOS transistor 118, a fourth NMOS transistor 120 and a fifth NMOS transistor 112. A gate terminal of the third PMOS transistor 114 receives the, first input A 103 and a source terminal of the third PMOS transistor 114 is coupled to the power terminal VDD. A gate terminal of the fourth PMOS transistor 116 receives the second input B 107 and a source terminal of the fourth PMOS transistor 116 is coupled to the power terminal VDD.

A drain terminal of the third PMOS transistor 114 and a drain terminal of the fourth PMOS transistor 116 are coupled to a source terminal of the fifth PMOS transistor 110. A gate terminal of the fifth PMOS transistor 110 receives a third input C 109 and a drain terminal of the fifth PMOS transistor 110 is coupled to the first node M.

A gate terminal of the third NMOS transistor 118 receives the first input A 103 and a source terminal of the third NMOS transistor 118 is coupled to the ground terminal. A gate terminal of the fourth NMOS transistor 120 receives the second input B 107 and a source terminal of the fourth NMOS transistor 120 is coupled to the ground terminal.

A drain terminal of the third NMOS transistor 118 and a drain terminal of the fourth NMOS transistor 120 are coupled to a source terminal of the fifth NMOS transistor 112. A gate terminal of the fifth NMOS transistor 112 receives a third input C 109 and a drain terminal of the fifth NMOS transistor 112 is coupled to the first node M and to the drain terminal of the fifth PMOS transistor 110.

The first node M receives an output of the carry generation circuit 105. The first inverter 155 is coupled to the first node M and generates a carry Co 156 on receiving the output of the carry generation circuit 105. The sum generation circuit 125 is explained now. The sum generation circuit 125 is coupled to the first node M and receives the output of the carry generation circuit 105. A gate terminal of each of a sixth PMOS transistor 126, a seventh PMOS transistor 128 and an eighth PMOS transistor 130 receive the first input A 103, the second input B 107 and the third input C 109 respectively.

A source terminal of each of the sixth PMOS transistor 126, the seventh PMOS transistor 128 and the eighth PMOS transistor 130 is coupled to the power terminal VDD. A drain terminal of each of the sixth PMOS transistor 126, the seventh PMOS transistor 128 and the eighth PMOS transistor 130 is coupled to a source terminal of a ninth PMOS transistor 122.

A gate terminal of each of a sixth NMOS transistor 132, a seventh NMOS transistor 134 and an eighth NMOS transistor 136 receive the first input A 103, the second input B 107 and the third input C 109 respectively. A source terminal of each of the sixth NMOS transistor 132, the seventh NMOS transistor 134 and the eighth NMOS transistor 136 is coupled to the ground terminal. A drain terminal of each of the sixth NMOS transistor 132, the seventh NMOS transistor 134 and the eighth NMOS transistor 136 is coupled to a source terminal of a ninth NMOS transistor 124.

A gate terminal of each of the ninth PMOS transistor 122 and the ninth NMOS transistor 124 are coupled to the first node M and receive the output of the carry generation circuit 105. A drain terminal of the ninth PMOS transistor 122 and a drain terminal of the ninth NMOS transistor 124 are coupled to a second node K.

A gate terminal of each of a tenth PMOS transistor 140, an eleventh PMOS transistor 142 and a twelfth PMOS transistor 144 receive the first input A 103, the second input B 107 and the third input C 109 respectively. A source terminal of the twelfth PMOS transistor 144 is coupled to the power terminal VDD. A drain terminal of the twelfth PMOS transistor 144 is coupled to a source terminal of the eleventh PMOS transistor 142 and a drain terminal of the eleventh PMOS transistor 142 is coupled to a source terminal of the tenth PMOS transistor 140.

A gate terminal of each of a tenth NMOS transistor 146, an eleventh NMOS transistor 148 and a twelfth NMOS transistor 150 receive the first input A 103, the second input B 107 and the third input C 109 respectively. A source terminal of the twelfth NMOS transistor 150 is coupled to the wound terminal. A drain terminal of the twelfth NMOS transistor 150 is coupled to a source terminal of the eleventh NMOS transistor 148 and a drain terminal of the eleventh NMOS transistor 148 is coupled to a source terminal of the tenth NMOS transistor 146.

A drain terminal of the tenth PMOS transistor 140 and a drain terminal of the tenth NMOS transistor 146 are coupled to the second node K. The second node K receives an output of the sum generation circuit 125. The second inverter 160 is coupled to the second node K and generates a sum S 162 on receiving the output of the sum generation circuit 125.

The operation of the conventional full adder 100 illustrated in FIG. 1 is explained now. The carry generation circuit 105 receives the first input A 103, the second input B 107 and the third input C 109 and generates an inverted carry at the first node M. The inverted carry is defined as:

$$\text{Inverted Carry } (\overline{Co}) = \overline{AB + BC + CA} \quad (1)$$

The first inverter 155 receives the inverted carry generated at node M. The first inverter 155 generates a carry Co 156 on receiving the inverted carry ($\overline{Co}$). The sum generation circuit 125 receives the inverted carry from the carry generation circuit 105, and the first input A 103, the second input B 107 and the third input C 109. The sum generation circuit 125 generates an inverted sum at the second node K. The inverted sum is defined as:

$$\text{Inverted Sum} = \overline{(A+B+C)(\overline{Co}) + ABC} \quad (2)$$

The second inverter 160 is coupled to the second node K and generates a sum S 162 on receiving the inverted sum. The conventional full adder 100 utilizes a minimum of 28 transistors. Also, there is a dependency of the sum S 162 on the inverted carry which reduces the processing speed.

Figure 2:
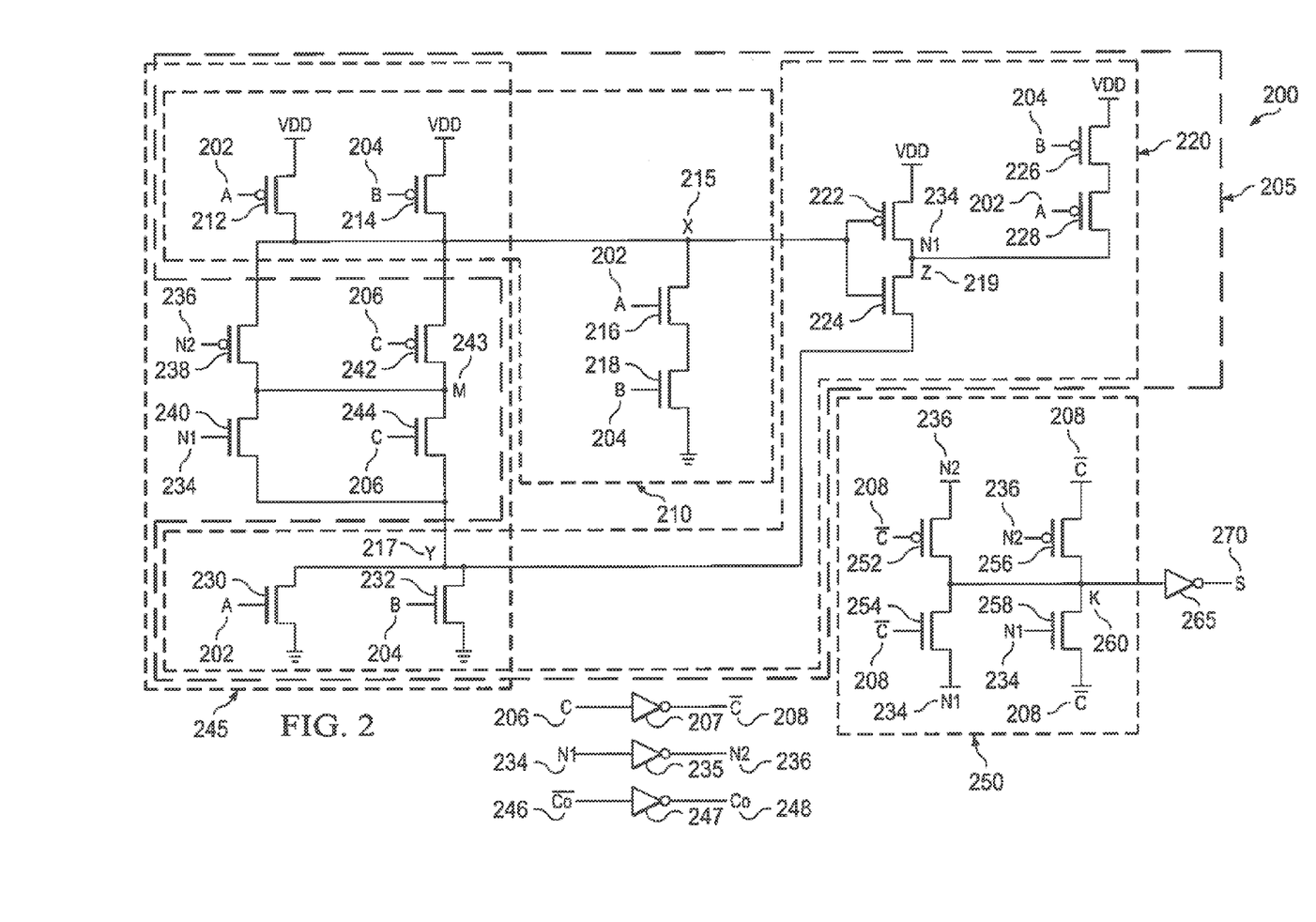
FIG. 2 illustrates a full adder, according to an embodiment.

FIG. 2 illustrates a full adder 200, according to an embodiment. The full adder 200 includes an exclusive NOR logic circuit 205, a carry generation circuit 245, a sum generation circuit 250, a first inverter 235, a second inverter 247, a third inverter 265 and a fourth inverter 207. The exclusive NOR logic circuit 205 receives the first input A 202 and a second input B 204. The first inverter 235 receives an output N1 234 of the exclusive NOR logic circuit 205 and generates the exclusive OR output N2 236.

The exclusive NOR logic circuit 205 includes a first NAND logic circuit 210 and a second NAND logic circuit 220. The first NAND logic circuit 210 receives the first input A 202 and the second input B 204. The second NAND logic circuit 220 receives an output of the first NAND logic circuit 210, the first input A 202 and the second input B 204. The second NAND logic circuit 220 generates the output N1 234 of the exclusive NOR logic circuit 205.

The first NAND logic circuit 210 includes a first PMOS transistor 212 whose gate terminal receives the first input A 202 and whose drain terminal is coupled to a first node X 215. A gate terminal of a second PMOS transistor 214 receives the second input B 204 and a drain terminal of the second PMOS transistor 214 is coupled to the first node X 215. A source terminal of each of the first PMOS transistor 212 and the second PMOS transistor 214 is coupled to a power terminal VDD.

The first NAND logic circuit 210 also includes a first NMOS transistor 216 and a second NMOS transistor 218. A gate terminal of the first NMOS transistor 216 receives the first input A 202 and a drain terminal of the first NMOS transistor 216 is coupled to the first node X 215. A gate terminal of the second NMOS transistor 218 receives the second input B 204 and a drain terminal of the second NMOS transistor 218 is coupled to a source terminal of the first NMOS transistor 216. A source terminal of the second NMOS transistor 218 is coupled to a ground terminal.

The second NAND logic circuit 220 is coupled to the first NAND logic circuit 210. The second NAND logic circuit 220 is explained now. A gate terminal of a third PMOS transistor 222 is coupled to the first node X 215. A source terminal of the third PMOS transistor 222 is coupled to the power terminal VDD. A gate terminal of the third NMOS transistor 224 is coupled to the first node X 215. A source terminal of the third NMOS transistor 224 is coupled to a second node Y 217. A drain terminal of the third NMOS transistor 224 is coupled to a drain terminal of the third PMOS transistor 222 to form a third node Z 219.

A gate terminal of the fourth PMOS transistor 226 receives the second input B 204. A source terminal of the fourth PMOS transistor 226 is coupled to the power terminal VDD. A gate terminal of a fifth PMOS transistor 228 receives the first input A 202. A drain terminal of the fifth PMOS transistor 228 is coupled to the third node Z 219. A source terminal of the fifth PMOS transistor 228 is coupled to a drain terminal of the fourth PMOS transistor 226.

A gate terminal of a fourth NMOS transistor 230 receives the first input A 202. A source terminal of the fourth NMOS transistor 230 is coupled to the ground terminal. A gate terminal of a fifth NMOS transistor 232 receives the second input B 204. A source terminal of the fifth NMOS transistor 232 is coupled to the ground terminal. A drain terminal of the fifth NMOS transistor 232 is coupled to as drain terminal of the fourth NMOS transistor 230 to form the second node Y 217.

The output N1 234 of the exclusive NOR logic circuit 205 is generated at the third node Z 219. The output N1 234 is defined as:

$$N1 = A \text{ XNOR } B = \overline{(A \oplus B)} = \overline{AB} \cdot (A+B) \quad (3)$$

Thus, the exclusive NOR logic circuit 205 performs XNOR logic operation (exclusive NOR logic operation) on the first input A 202 and the second input B 204. The first inverter 235 is coupled to the third node Z 219 and receives the output N1 234 of the exclusive NOR logic circuit 205. The first inverter 235 generates the exclusive OR output N2 236 by inverting the output N1 234 of the exclusive NOR logic circuit 205. The exclusive OR output N2 is defined as:

$$N2 = A \text{ XOR } B = \overline{A}B + A\overline{B} \tag{4}$$

Thus, a XOR logic operation is performed on the first input A 202 and the second input B 204 to obtain the exclusive OR output N2. The carry generation circuit 245 includes a sixth PMOS transistor 238, a sixth NMOS transistor 240, a seventh PMOS transistor 242 and a seventh NMOS transistor 244. The first PMOS transistor 212, the second PMOS transistor 214, the fourth NMOS transistor 230 and the fifth NMOS transistor 232 are shared between the carry generation circuit 245 and the exclusive NOR logic circuit 205.

A gate terminal of the sixth PMOS transistor 238 receives the exclusive OR output N2 236 from the first inverter 235. A source terminal of the sixth PMOS transistor 238 is coupled to the first node X 215. A gate terminal of the sixth NMOS transistor 240 receives the output N1 234 of the exclusive NOR logic circuit 205. A source terminal of the sixth NMOS transistor 240 is coupled to the second node Y 217.

A gate terminal of the seventh PMOS transistor 242 receives the third input C 206. A source terminal of the seventh PMOS transistor 242 is coupled to the first node X 215. A gate terminal of the seventh NMOS transistor 244 receives the third input C 206. A source terminal of the seventh NMOS transistor 244 is coupled to the second node Y 217. A drain terminal of the seventh NMOS transistor 244 is coupled to a drain terminal of the seventh PMOS transistor 242 to form a fourth node M 243. A drain terminal of the sixth PMOS transistor 238 and a drain terminal of the sixth NMOS transistor 240 are coupled to the fourth node M 243.

The inverted carry ($\overline{Co}$) 246 is generated at the fourth node M 243. The inverted carry ($\overline{Co}$) 246 is defined as $$\overline{(Co)} = \overline{(A+B)(C+A \oplus B)} \tag{5}$$

The second inverter 247 is coupled to the fourth node M 243. The second inverter 247 generates a carry (Co) 248 on receiving the inverted carry ($\overline{Co}$) 246. The full adder 200 further includes the fourth inverter 207 that generates an inverted third input ($\overline{C}$) 208 on receiving the third input C 206.

The sum generation circuit 250 is explained now. The sum generation circuit 250 receives the output N1 234 of the exclusive NOR logic circuit 205, the exclusive OR output N2 236 and the inverted third input ($\overline{C}$) 208. The sum generation circuit 250 generates an inverted sum. The sum generation circuit 250 includes an eighth PMOS transistor 252, an eighth NMOS transistor 254, a ninth PMOS transistor 256 and a ninth NMOS transistor 258. A gate terminal of the eighth PMOS transistor 252 receives the inverted third input ($\overline{C}$) 208. A source terminal of the eighth PMOS transistor 252 receives the exclusive OR output N2 236.

A gate terminal of the eighth NMOS transistor 254 receives the inverted third input ($\overline{C}$) 208. A source terminal of the eighth NMOS transistor 254 receives the output N1 234 of the exclusive NOR logic circuit 205. A gate terminal of the ninth PMOS transistor 256 receives the exclusive OR output N2 236 and a source terminal of the ninth PMOS transistor 256 receives the inverted third input ($\overline{C}$) 208.

A gate terminal of the ninth NMOS transistor 258 receives the output N1 234 of the exclusive NOR logic circuit 205. A source terminal of the ninth NMOS transistor 258 receives the inverted third input ($\overline{C}$) 208. A drain terminal of the ninth NMOS transistor 258 is coupled to a drain terminal of the ninth PMOS transistor 256 to form a fifth node K 260.

The sum generation circuit 250 generates the inverted sum which is generated at the fifth node K 260. The inverted sum is defined as:

$$\text{Inverted Sum} = \overline{(A \oplus B)} \oplus C \tag{6}$$

A drain terminal of the eighth PMOS transistor 252 and a drain terminal of the eighth NMOS transistor 254 are coupled to the fifth node K 260. The third inverter 265 is coupled to the fifth node K 260 and generates the sum (S) 270 on receiving the inverted sum.

The operation of the full adder 200 illustrated in FIG. 2 is explained now with the help of logic states. In a state, when each of the first input A 202, the second input B 204 and the third input C 206 is at logic '0', the first node X 215 is at logic '1' as well as the third node Z 219 is at logic '1' which represent the output N1 234 of the exclusive NOR logic circuit 205. Thus, the exclusive OR output N2 236 generated by the first inverter 235 is at logic '0'. The carry generation circuit 245 on receiving N1 234 and N2 236 generates an inverted carry ($\overline{Co}$) 246 which is at logic '1' and thus the carry (Co) is at logic '0'. Also, the sum generation circuit 250 receives the inverted third input ($\overline{C}$) 208 (which is at logic '1'), the output N1 234 of the exclusive NOR logic circuit 205 (which is at logic '1') and the exclusive OR output N2 236 (which is at logic '0'). Thus, the sum generation circuit 250 through the ninth PMOS transistor 256 generates the inverted sum which is at logic '1'. The inverted sum is generated at the fifth node K 260. The sum S 270 generated by the third inverter 265 is at logic '0'.

In a state, when the first input A 202 and the second input B 204 remain at logic '0' and the third input C 206 transactions to logic '1', the first node X 215 remains at logic '1'. As a result, the third node Z 219 is remains at logic '1' which represent the output N1 234 of the exclusive NOR logic circuit 205. Thus, the exclusive OR output N2 236 generated by the first inverter 235 remains at logic '0'. The carry generation circuit 245 on receiving N1 234 and N2 236 generates an inverted carry ($\overline{Co}$) 246 which is at logic '1' and thus the carry (Co) is at logic '0'. Also, the sum generation circuit 250 receives the inverted third input ($\overline{C}$) 208 (which is at logic '0'), the output N1 234 of the exclusive NOR logic circuit 205 (which is at logic '1') and the exclusive OR output N2 236 (which is at logic '0'). Thus, the sum generation circuit 250 through the ninth NMOS transistor 258 generates the inverted sum which is at logic '0'. The inverted sum is generated at the fifth node K 260. The sum S 270 generated by the third inverter 265 is at logic '1'.

In a state, when the first input A 202 remains at logic '0' and the second input B 204 transitions to logic '1' and the third input C 206 transitions to logic '0', the first node X 215 remains at logic '1'. However, the third node Z 219 transitions to logic '0' through the third NMOS transistor 224 and the fifth NMOS transistor 232. The third node Z 219 represent the output N1 234 of the exclusive NOR logic circuit 205. Thus, the exclusive OR output N2 236 generated by the first inverter 235 is at logic '1'. The carry generation circuit 245 through the first PMOS transistor 212 and the seventh PMOS transistor 242 generates an inverted carry ($\overline{Co}$) 246 which is at logic '1' and thus the carry (Co) is at logic '0'. Also, the sum generation circuit 250 receives the inverted third input ($\overline{C}$) 208 (which is at logic '1'), the output N1 234 of the exclusive NOR logic circuit 205 (which is at logic '0') and the exclusive OR output N2 236 (which is at logic '1'). Thus, the sum generation circuit 250 through the eighth NMOS transistor 254 generates the inverted sum which is at logic '0'. The inverted sum is generated at the fifth node K 260. The sum S 270 generated by the third inverter 265 is at logic '1'.

In a state, when the first input A 202 remains at logic '0' and the second input B 204 transitions to logic '1' and the third input C 206 transitions to logic '1', the first node X 215 remains at logic '1'. The third node Z 219 remains at logic '0' through the third NMOS transistor 224 and the fifth NMOS transistor 232. The third node Z 219 represent the output N1 234 of the exclusive NOR logic circuit 205. Thus, the exclusive OR output N2 236 generated by the first inverter 235 is at logic '1'. The carry generation circuit 245 through the seventh NMOS transistor 244 and the fifth NMOS transistor 232 generates an inverted carry ($\overline{Co}$) 246 which is at logic '0' and thus the carry (Co) is at logic '1'. Also, the sum generation circuit 250 receives the inverted third input ($\overline{C}$) 208 (which is at logic '0'), the output N1 234 of the exclusive NOR logic circuit 205 (which is at logic '0') and the exclusive OR output N2 236 (which is at logic '1'). Thus, the sum generation circuit 250 through the eighth PMOS transistor 252 generates the inverted sum which is at logic '1'. The inverted sum is generated at the fifth node K 260. The sum S 270 generated by the third inverter 265 is at logic '0'.

In a state, when the first input A 202 transitions to logic '1' and the second input B 204 transitions to logic '0' and the third input C 206 transitions to logic '0', the first node X 215 remains at logic '1'. However, the third node Z 219 transitions to logic '0' through the third NMOS transistor 224 and the fourth NMOS transistor 230. The third node Z 219 represent the output N1 234 of the exclusive NOR logic circuit 205. Thus, the exclusive OR output N2 236 generated by the first inverter 235 is at logic '1'. The carry generation circuit 245 through the second PMOS transistor 214 and the seventh PMOS transistor 242 generates an inverted carry ($\overline{Co}$) 246 which is at logic '1' and thus the carry (Co) is at logic '0'. Also, the sum generation circuit 250 receives the inverted third input ($\overline{C}$) 208 (which is at logic '1'), the output N1 234 of the exclusive NOR logic circuit 205 (which is at logic '0') and the exclusive OR output N2 236 (which is at logic '1'). Thus, the sum generation circuit 250 through the eighth NMOS transistor 254 generates the inverted sum which is at logic '0'. The inverted sum is generated at the fifth node K 260. The sum S 270 generated by the third inverter 265 is at logic '1'.

In a state, when the first input A 202 remains at logic and the second input B 204 remains at logic '0' and the third input C 206 transitions to logic the first node X 215 remains at logic '1'. Also, the third node Z 219 remains at logic '0' through the third NMOS transistor 224 and the fourth NMOS transistor 230. The third node Z 219 represent the output N1 234 of the exclusive NOR logic circuit 205. Thus, the exclusive OR output N2 236 generated by the first inverter 235 is at logic '1'. The carry generation circuit 245 through the seventh NMOS transistor 244 and the fourth NMOS transistor 230 generates an inverted carry ($\overline{Co}$) 246 which is at logic '0' and thus the carry (Co) is at logic '1'. Also, the sum generation circuit 250 receives the inverted third input ($\overline{C}$) 208 (which is at logic '0'), the output N1 234 of the exclusive NOR logic circuit 205 (which is at logic '0') and the exclusive OR output N2 236 (which is at logic '1'). Thus, the sum generation circuit 250 through the eighth NMOS transistor 252 generates the inverted sum which is at logic '1'. The inverted sum is generated at the fifth node K 260. The sum S 270 generated by the third inverter 265 is at logic '0'.

In a state, when the first input A 202 remains at logic '1' and the second input B 204 transitions to logic '1' and the third input C 206 transitions to logic '0', the first node X 215 transitions to logic '0' through the first NMOS transistor 216 and the second NMOS transistor 218. Hence the third node Z 219 transitions to logic '1' which represent the output N1 234 of the exclusive NOR logic circuit 205. Thus, the exclusive OR output N2 236 generated by the first inverter 235 is at logic '0'. The carry generation circuit 245 on receiving N1 234 and N2 236 generates an inverted carry ($\overline{Co}$) 246 which is at logic '0' through the sixth NMOS transistor 240, the fourth NMOS transistor 230 and the fifth NMOS transistor 232. Thus the carry (Co) is at logic '1'. Also, the sum generation circuit 250 receives the inverted third input ($\overline{C}$) 208 (which is at logic '1'), the output N1 234 of the exclusive NOR logic circuit 205 (which is at logic '1') and the exclusive OR output N2 236 (which is at logic '0'). Thus, the sum generation circuit 250 through the ninth PMOS transistor 256 generates the inverted sum which is at logic '1'. The inverted sum is generated at the fifth node K 260. The sum S 270 generated by the third inverter 265 is at logic '0'.

In a state, when the first input A 202 remains at logic '1' and the second input B 204 remains at logic '1' and the third input C 206 transitions to logic '1', the first node X 215 remains at logic '0' through the first NMOS transistor 216 and the second NMOS transistor 218. Hence the third node Z 219 remains at logic '1' which represent the output N1 234 of the exclusive NOR logic circuit 205. Thus, the exclusive OR output N2 236 generated by the first inverter 235 is at logic '0'. The carry generation circuit 245 on receiving N1 234 and N2 236 generates an inverted carry ($\overline{Co}$) 246 which is at logic '0' through the sixth NMOS transistor 240, the seventh NMOS transistor 244 and the fourth NMOS transistor 230 and the fifth NMOS transistor 232. Thus, the carry (Co) 248 is at logic '1'. Also, the sum generation circuit 250 receives the inverted third input ($\overline{C}$) 208 (which is at logic '0'), the output N1 234 of the exclusive NOR logic circuit 205 (which is at logic '1') and the exclusive OR output N2 236 (which is at logic '0'). Thus, the sum generation circuit 250 through the ninth NMOS transistor 258 generates the inverted sum which is at logic '0'. The inverted sum is generated at the fifth node K 260. The sum S 270 generated by the third inverter 265 is at logic '1'.

Table 1 summarizes the logic states of the full adder 200.

TABLE 1

| A | B | C | First Node 'X' | Third Node 'Z' | N2 | Co | S |
|---|---|---|---|---|---|---|---|
| 0 | 0 | 0 | 1 | 1 | 0 | 0 | 0 |
| 0 | 0 | 1 | 1 | 1 | 0 | 0 | 1 |
| 0 | 1 | 0 | 1 | 0 | 1 | 0 | 1 |
| 0 | 1 | 1 | 1 | 0 | 1 | 1 | 0 |
| 1 | 0 | 0 | 1 | 0 | 1 | 0 | 1 |
| 1 | 0 | 1 | 1 | 0 | 1 | 1 | 0 |
| 1 | 1 | 0 | 0 | 1 | 0 | 1 | 0 |
| 1 | 1 | 1 | 0 | 1 | 0 | 1 | 1 |

The full adder 200 requires a total of 26 transistors which directly translates to reduction in chip area and saving of costs when compared to conventional full adder 100 illustrated in FIG. 1. Also, with less transistor count as compared to conventional full adder 100, the power consumed by the full adder 200 is also low. Since, the generation of carry (Co)

248 and the sum (S) 270 are independent, the full adder 200 provides a better processing speed as compared to conventional full adder 100. Thus, the sum (S) 270 is not dependent on the carry (Co) 248 which reduces the overall response time of the full adder 200 when the inputs transition from one state to another.

Figure 3:
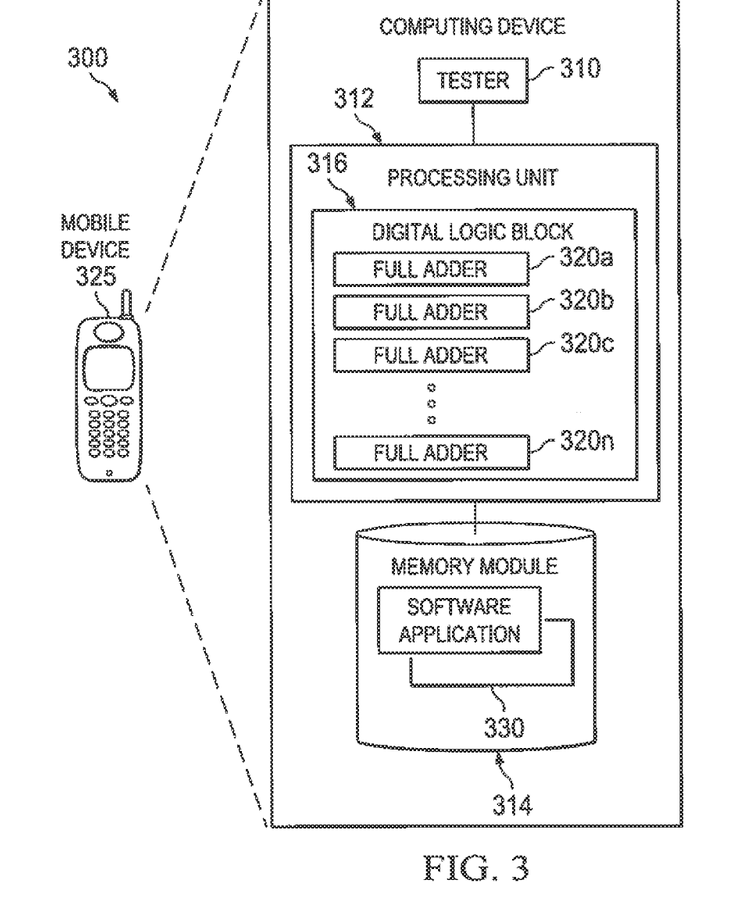
FIG. 3 illustrates a computing device, according to an embodiment.

FIG. 3 illustrates a computing device 300, according to an embodiment. The computing device 300 is, or is incorporated into, a mobile communication device 325, such as a mobile phone, a personal digital assistant, a personal computer, or any other type of electronic system.

In some embodiments, the computing device 300 comprises a megacell or a system-on-chip (SoC) which includes control logic such as a processing unit 312 (Central Processing Unit), a memory module 314 (e.g., random access memory (RAM)) and a tester 310. The processing unit 312 can be, for example, a CISC-type (Complex Instruction Set Computer) CPU, RISC-type CPU (Reduced Instruction Set Computer), or a digital signal processor (DSP). The memory module 314 (which can he memory such as RAM, flash memory, or disk storage) stores one or more software application 330 (e.g. embedded applications) that, when executed by the processing unit 312, perform any suitable function associated with the computing device 300.

The tester 310 comprises logic that supports testing and debugging of the computing device 300 executing the software application 330. For example, the tester 310 can be used to emulate a defective or unavailable component(s) of the computing device 300 to allow verification of how the component(s), were it actually present on the computing device 300, would perform in various situations (e.g., how the component(s) would interact with the software application 330). In this way, the software application 330 can be debugged in an environment which resembles post-production operation.

The processing unit 312 typically comprises memory and logic which store information frequently accessed from the memory module 314. Various subsystems (such as the processing unit 312 and the memory module 314) of the computing device 300 include digital logic block 316 which are used during the execution of the software application 330. The digital logic block 316 includes a plurality of full adders illustrated as 320a, 320b, 320c and 320n.

At least one full adder of the plurality of full adders (320a-320n) is similar to the full adder 200 (illustrated in FIG. 2) in connection and operation. In one example, the full adder 320a is analogous to the full adder 200 in connection and operations. The full adder 320a has reduced power consumption and also the sum (S) is not dependent on the carry (Co) which reduces the overall response time of the full adder 320a when the inputs transition from one state to another.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections.

Further, the term "high" is generally intended to describe a signal that is at logic "1," and the term "low" is generally intended to describe a signal that is at logic "0." The term "on" applied to a transistor or group of transistors is generally intended to describe gate biasing to enable current flow through the transistor or transistors. Also, the terms "inactivation" or "inactivated" or turn "OFF" or turned "OFF" is used to describe a deactivation of a device, a component or a signal. The terms "activation" or "activated" or turned "ON" describes activation of a device, a component or a signal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A full adder comprising:
   an exclusive NOR logic circuit configured to receive a first input and a second input;
   a first inverter configured to receive an output of the exclusive NOR logic circuit and configured to generate an exclusive OR output;
   a carry generation circuit configured to receive the output of the exclusive NOR logic circuit, the exclusive OR output and a third input, the carry generation circuit configured to generate an inverted carry; and
   a sum generation circuit configured to receive the output of the exclusive NOR logic circuit, the exclusive OR output and the third input, the sum generation circuit configured to generate an inverted sum.

2. The full adder of claim 1 further comprising:
   a second inverter coupled to the carry generation circuit and configured to generate a carry on receiving the inverted carry; and
   a third inverter coupled to the sum generation circuit and configured to generate a sum on receiving the inverted sum.

3. The full adder of claim 1, wherein the exclusive NOR logic circuit comprises:
   a first NAND logic circuit configured to receive the first input and the second input; and
   a second NAND logic circuit configured to receive an output of the first NAND logic circuit, the first input and the second input, the second NAND logic circuit configured to generate the output of the exclusive NOR logic circuit.

4. The full adder of claim 3, wherein the first NAND logic circuit comprises:
   a first PMOS transistor whose gate terminal is configured to receive the first input and whose drain terminal is coupled to a first node;
   a second PMOS transistor whose gate terminal is configured to receive the second input and whose drain terminal is coupled to the first node, wherein a source terminal of each of the first PMOS transistor and the second PMOS transistor is coupled to a power terminal;
   a first NMOS transistor whose gate terminal is configured to receive the first input and whose drain terminal is coupled to the first node; and
   a second NMOS transistor whose gate terminal is configured to receive the second input and whose drain terminal is coupled to a source terminal of the first NMOS transistor, wherein a source terminal of the second NMOS transistor is coupled to a ground terminal.

5. The full adder of claim 3, wherein the second NAND logic circuit comprises:
   a third PMOS transistor whose gate terminal is coupled to the first node and whose source terminal is coupled to the power terminal;
   a third NMOS transistor whose gate terminal is coupled to the first node and whose source terminal is coupled to a second node, wherein a drain terminal of the third NMOS transistor is coupled to a drain terminal of the third PMOS transistor to form a third node;
   a fourth PMOS transistor whose gate terminal is configured to receive the second input and whose source terminal is coupled to the power terminal,
   a fifth PMOS transistor whose gate terminal is configured to receive the first input and whose drain terminal is coupled to the third node, wherein a source terminal of the fifth PMOS transistor is coupled to a drain terminal of the fourth PMOS transistor;
   a fourth NMOS transistor whose gate terminal is configured to receive the first input and whose source terminal is coupled to the ground terminal; and
   a fifth NMOS transistor whose gate terminal is configured to receive the second input and whose source terminal is coupled to the ground terminal, wherein a drain terminal of the fifth NMOS transistor is coupled to a drain terminal of the fourth NMOS transistor to form the second node.

6. The full adder of claim 3, wherein the output of the exclusive NOR logic circuit is generated at the third node.

7. The full adder of claim 1, wherein the carry generation circuit further comprises:
   a sixth PMOS transistor whose gate terminal is configured to receive the exclusive OR output from the first inverter and whose source terminal is coupled to the first node;
   a sixth NMOS transistor whose gate terminal is configured to receive the output of the exclusive NOR logic circuit and whose source terminal is coupled to the second node;
   a seventh PMOS transistor whose gate terminal is configured to receive the third input and whose source terminal is coupled to the first node; and
   a seventh NMOS transistor whose gate terminal is configured to receive the third input and whose source terminal is coupled to the second node, wherein a drain terminal of the seventh NMOS transistor is coupled to a drain terminal of the seventh PMOS transistor to form a fourth node, such that the inverted carry is generated at the fourth node.

8. The full adder of claim 7, wherein a drain terminal of the sixth PMOS transistor and a drain terminal of the sixth NMOS transistor are coupled to the fourth node.

9. The full adder of claim 7, wherein the first PMOS transistor, the second PMOS transistor, the fourth NMOS transistor and the fifth NMOS transistor are shared between the carry generation circuit and the exclusive NOR logic circuit.

10. The full adder of claim 7, wherein the second inverter is coupled to the fourth node and configured to generate the carry on receiving the inverted carry.

11. The full adder of claim 1 further comprising a fourth inverter configured to generate an inverted third input on receiving the third input.

12. The full adder of claim 1, wherein the sum generation circuit comprises:
   an eighth PMOS transistor whose gate terminal is configured to receive the inverted third input and whose source terminal is configured to receive the exclusive OR output;
   an eighth NMOS transistor whose gate terminal is configured to receive the inverted third input and whose source terminal is configured to receive the output of the exclusive NOR logic circuit;
   a ninth PMOS transistor whose gate terminal is configured to receive the exclusive OR output and whose source terminal is configured to receive the inverted third input; and
   a ninth NMOS transistor whose gate terminal is configured to receive the output of the exclusive NOR logic circuit and whose source terminal is configured to receive the inverted third input, wherein a drain terminal of the ninth NMOS transistor is coupled to a drain terminal of the ninth PMOS transistor to form a fifth node, such that the inverted sum is generated at the fifth node.

13. The full adder of claim 12, wherein a drain terminal of the eighth PMOS transistor and a drain terminal of the eighth NMOS transistor are coupled to the fifth node.

14. The full adder of claim 12, wherein the third inverter is coupled to the fifth node and configured to generate the sum on receiving the inverted sum.

15. A method comprising:
   performing an exclusive NOR logic operation on a first input and a second input in an exclusive NOR logic circuit,
   inverting an output of the exclusive NOR logic circuit to generate an exclusive OR output,
   generating an inverted carry from the output of the exclusive NOR logic circuit, the exclusive OR output and a third input; and
   generating an inverted sum from the output of the exclusive NOR logic circuit, the exclusive OR output and the third input.

16. The method of claim 15 further comprising:
   inverting the inverted carry to generate a carry; and
   inverting the inverted sum to generate a sum.

17. A computing device comprising:
   a processing unit,
   a memory module coupled to the processing unit, the processing unit comprising
   a digital logic block, the digital logic block comprising a plurality of full adders,
   and a full adder of the plurality of full adder comprising:
      an exclusive NOR logic circuit configured to receive a first input and a second input;
      a first inverter configured to receive an output of the exclusive NOR logic circuit and configured to generate an exclusive OR output;
      a carry generation circuit configured to receive the output of the exclusive NOR logic circuit, the exclusive OR output and a third input, the carry generation circuit configured to generate an inverted carry;
      a second inverter coupled to the carry generation circuit and configured to generate a carry on receiving the inverted carry;
      a sum generation circuit configured to receive the output of the exclusive NOR logic circuit, the exclusive OR output and the third input, the sum generation circuit configured to generate an inverted sum; and a third inverter coupled to the sum generation circuit and configured to generate a sum on receiving the inverted sum.

18. The computing device of 17, wherein the exclusive NOR logic circuit comprises:
   a first NAND logic circuit configured to receive the first input and the second input; and
   a second NAND logic circuit configured to receive an output of the first NAND logic circuit, the first input and the second input, the second NAND logic circuit configured to generate the output of the exclusive NOR logic circuit.

* * * * *